United States Patent
Liao et al.

(10) Patent No.: US 9,239,498 B2
(45) Date of Patent: Jan. 19, 2016

(54) LIQUID CRYSTAL DISPLAY DEVICE AND MANUFACTURING METHOD THEREOF

(75) Inventors: Bing-jei Liao, Shenzhen (CN);
Chialiang Lin, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 329 days.

(21) Appl. No.: 13/641,109

(22) PCT Filed: May 17, 2012

(86) PCT No.: PCT/CN2012/075630
§ 371 (c)(1),
(2), (4) Date: Oct. 13, 2012

(87) PCT Pub. No.: WO2013/166741
PCT Pub. Date: Nov. 14, 2013

(65) Prior Publication Data
US 2013/0293819 A1    Nov. 7, 2013

(51) Int. Cl.
*G02F 1/1343*    (2006.01)
*G02F 1/1333*    (2006.01)
*C23C 14/35*    (2006.01)
*G02F 1/1345*    (2006.01)
*C23C 14/04*    (2006.01)
*G02F 1/1337*    (2006.01)

(52) U.S. Cl.
CPC ........ *G02F 1/134309* (2013.01); *C23C 14/042* (2013.01); *C23C 14/35* (2013.01); *G02F 1/1345* (2013.01); *G02F 1/133365* (2013.01); *G02F 1/133788* (2013.01); *G02F 2001/133742* (2013.01)

(58) Field of Classification Search
CPC ................ G02F 1/133788; G02F 2001/13775; G02F 2001/133715; G02F 1/134309; G02F 1/1345; G02F 2001/133742; C23C 14/042
See application file for complete search history.

(56) References Cited

U.S. PATENT DOCUMENTS

| 4,683,183 A * | 7/1987 | Ono ............................... 430/311 |
| 2009/0270007 A1 * | 10/2009 | Seok et al. ....................... 445/25 |
| 2010/0091230 A1 * | 4/2010 | Liu et al. ....................... 349/191 |
| 2011/0242468 A1 * | 10/2011 | Choi et al. ..................... 349/129 |

FOREIGN PATENT DOCUMENTS

CN    101349841 A *    1/2009

* cited by examiner

*Primary Examiner* — Richard Kim
*Assistant Examiner* — Ryan Crockett
(74) *Attorney, Agent, or Firm* — Andrew C. Cheng

(57) ABSTRACT

The present invention provides a liquid crystal display device, which includes a plurality of pixel units. Each of the pixel units further includes a liquid crystal layer, a pixel electrode and a corresponding electrode. The pixel electrode and the corresponding electrode are disposed on two opposite sides of liquid crystal layer. The corresponding electrode further includes a first electrode pattern disposed oppositely to the pixel electrode, and a second electrode pattern connected to the first electrode pattern for applying an external voltage to the first electrode pattern so as to form an alignment electric field for the liquid crystal layer between the first electrode pattern and the pixel electrode. The present invention changes the way in which the external voltage is applied, and introduces the external voltage from one side of the color filter substrate to improve success rate of liquid crystal alignment, reduce energy-consumption and reduce waste.

11 Claims, 8 Drawing Sheets

LIQUID CRYSTAL DISPLAY DEVICE AND MANUFACTURING METHOD THEREOF

BACKGROUND OF THE INVENTION

1. Field of the Invention

The present invention relates to the field of liquid crystal displaying techniques, and in particular to a liquid crystal display device and manufacturing method thereof.

2. The Related Arts

The current liquid crystal display device employing polymer sustained vertical alignment (PSVA) display modes mainly includes an array substrate (TFT substrate), a color filer (CF) substrate disposed oppositely to TFT substrate, and a liquid crystal layer sandwiched between the two substrates. Compared to liquid crystal display panels using wide view angle display modes, such as, multi-domain vertical alignment (MVA), patterned vertical alignment (PVA), PSVA display mode has an advantage that the CF substrate includes neither bumps nor slits in indium tin oxides layer.

During the cell process, the known PSVA technique achieves liquid crystal alignment through applying external voltage on array substrate and CF substrate, and using UV radiation to make reactive monomers in the liquid crystal to line up according to electric field formed by applied external voltage. The way to apply external voltage is usually performed by introducing an external voltage from one side of array substrate, and then external voltage is conducted to CF substrate through conductive seal disposed between the two substrates. The approach of applying voltage through array substrate is restricted by the yield rate of the array substrate, and no repair can be performed after the cell process is completed.

In summary, it is desired to have a liquid crystal display device and a manufacturing method thereof to change the way to apply external voltage and to improve the yield rate of the cell process.

SUMMARY OF THE INVENTION

The technical issue to be addressed by the present invention is to provide a liquid crystal display device and manufacturing method thereof, to solve the problem of known techniques of applying external voltage through side of array substrate being restricted by the yield rate of array substrate.

The present invention provides a liquid crystal display device, which comprises: a plurality of pixel units. Each of the pixel units further comprises: a liquid crystal layer, comprising liquid crystal molecules with negative dielectric anisotropy and reactive monomers; a pixel electrode and corresponding electrode, disposed on two opposite sides of liquid crystal layer; the corresponding electrode further comprising: a plurality of first electrode patterns, disposed oppositely to pixel electrode; second electrode pattern, connected to the first electrode pattern, for applying an external voltage to the first electrode pattern so as to form an alignment electric field for liquid crystal layer between the first electrode pattern and pixel electrode; third electrode pattern, for connecting to first electrode pattern and second electrode pattern; and fourth electrode pattern, for connecting to a plurality of first electrode patterns.

According to a preferred embodiment of the present invention, the second electrode pattern is at least disposed on outer side of one of the plurality of first electrode patterns.

According to a preferred embodiment of the present invention, at least two first electrode patterns from the plurality of first electrode patterns are connected through fourth electrode pattern.

The present invention provides a liquid crystal display device, which comprises: a plurality of pixel units. Each of the pixel units further comprises: a liquid crystal layer, comprising liquid crystal molecules with negative dielectric anisotropy and reactive monomers; a pixel electrode and corresponding electrode, disposed on two opposite sides of liquid crystal layer; the corresponding electrode further comprising: first electrode pattern, disposed oppositely to pixel electrode; second electrode pattern, connected to the first electrode pattern, for applying an external voltage to the first electrode pattern so as to form an alignment electric field for liquid crystal layer between the first electrode pattern and pixel electrode.

According to a preferred embodiment of the present invention, the second electrode pattern is disposed on outer side of the first electrode pattern, and corresponding electrode further comprises third electrode pattern, for connecting to first electrode pattern and second electrode pattern.

According to a preferred embodiment of the present invention, the pixel unit comprises a plurality of first electrode patterns, and the second electrode pattern is at least disposed on outer side of one of the plurality of first electrode patterns.

According to a preferred embodiment of the present invention, corresponding electrode further comprises fourth electrode pattern, and at least two first electrode patterns from the plurality of first electrode patterns are connected through fourth electrode pattern.

The present invention provides a manufacturing method of liquid crystal display device, which comprises: providing an array substrate, the array substrate being disposed with pixel electrodes; providing a color filter substrate, the color filter substrate being disposed with first electrode pattern and second electrode pattern connected to the first electrode pattern; boxing the array substrate and the color filter substrate so that first electrode pattern and pixel electrodes being disposed oppositely and filling liquid crystal comprising reactive monomers and liquid crystal molecules with negative dielectric anisotropy between two substrates to from liquid crystal layer sandwiched between first electrode pattern and pixel electrode; applying a voltage through second electrode pattern to array substrate and color filter substrate, and using UV radiation on array substrate and color filter substrate so as to make reactive monomers of liquid crystal layer to line up according to electric field formed by the voltage to accomplish alignment on liquid crystal layer.

According to a preferred embodiment of the present invention, the step of providing a color filter substrate further comprises: using magnetron sputtering to form a transparent conductive thin film layer on the color filter substrate, providing a shadow mask so that the transparent conductive thin film layer forming first electrode pattern and second electrode pattern defined by the shadow mask during magnetron sputtering process.

According to a preferred embodiment of the present invention, the second electrode pattern is disposed on outer side of the first electrode pattern, the transparent conductive thin film layer forms third electrode pattern defined by the shadow mask during magnetron sputtering process, and third electrode pattern is for connecting to the first electrode pattern and the second electrode pattern.

According to a preferred embodiment of the present invention, the transparent conductive thin film layer forms a plurality of first electrode patterns and a plurality of second electrode patterns defined by the shadow mask during magnetron sputtering process; wherein the plurality of second electrode patterns are disposed on outer side of one of the plurality of first electrode patterns.

According to a preferred embodiment of the present invention, the transparent conductive thin film layer forms fourth electrode pattern defined by the shadow mask during magnetron sputtering process, and at least two of the plurality of first electrode patterns are connected through the fourth electrode pattern.

According to a preferred embodiment of the present invention, the plurality of first electrode patterns is cut by laser cutting.

The efficacy of the present invention is that to be distinguished from the state of the art. The present invention, through forming specific electrode patterns on transparent electrode layer of color filter substrate during film coalescent process, enables transparent electrode layer having specific electrode patterns to conduct external voltage to perform alignment on reactive monomers of liquid crystal; in other words, in the present invention, by changing the way external voltage is applied, the external voltage is introduced through one side of color filter substrate to prevent the application of external voltage from influence of yield rate of array substrate so as to improve success rate of liquid crystal alignment and reduce energy-consumption and cut down waste.

Furthermore, in the present invention, the second electrode pattern on the color filter substrate is specifically disposed for introducing external voltage, and a plurality of second electrode patterns can be disposed. Therefore, after the cell process, if a second electrode pattern is damaged, repairs can be performed or another second electrode pattern can be used instead.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following description refers to drawings and embodiments of the present invention.

The present invention provides a PSVA display mode liquid crystal display device and manufacturing method thereof.

Figure 1:
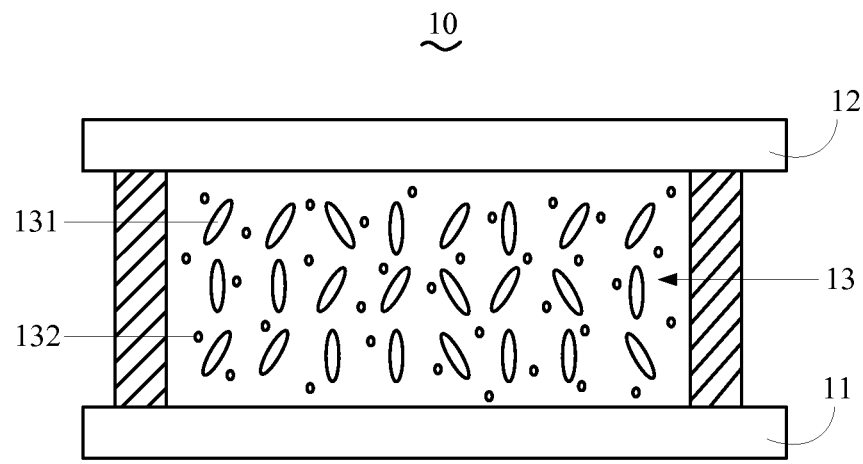
FIG. 1 is a schematic view showing the structure of a liquid crystal display device of the present invention prior to performing photo-alignment on liquid crystal layer.

FIG. 1 is a schematic view showing the structure of a liquid crystal display device of the present invention prior to performing photo-alignment on liquid crystal layer. As shown in FIG. 1, liquid crystal display device 10 includes array substrate 11, color filter substrate 12, disposed opposite to array substrate 11, and liquid crystal layer 13 sandwiched between the two substrates.

Liquid crystal layer 13 fills between array substrate 11 and color filter substrate 12, and includes liquid crystal molecules of negative dielectric anisotropy and reactive monomers 132 mixed with liquid crystal molecules 131, wherein liquid crystal molecules 131 are a liquid crystal material having the characteristics of displaying specific orientation when external voltage is applied, and the orientation can be controlled by applying an external voltage of a specific threshold.

Reactive monomer 132 is a monomer with polymerization characteristics. In the instant embodiment, the monomer with polymerization characteristics includes, but not limited to, Acrylate resin monomer, Methacrylate resin monomer, Vinyl resin monomer, Vinyloxy resin monomer, Epoxy resin monomer or any of the combination of the above monomers.

Figure 2:
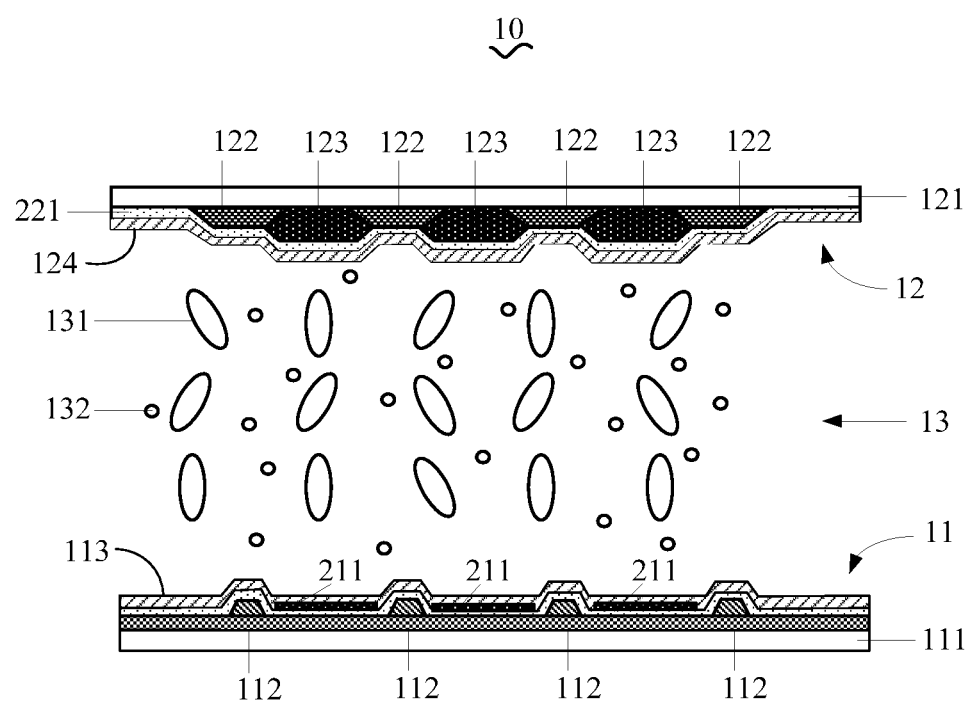
FIG. 2 is a partial enlarged view showing the liquid crystal display device according to the present invention.

Referring to FIG. 2, FIG. 2 is a partial enlarged view of the liquid crystal display device of the present invention shown in FIG. 1. In the present invention, liquid crystal display device 10 includes a plurality of pixel units, and each of pixel units includes R, G, B pixel units. Because each of pixel units has a similar structure, the following description uses a pixel as an example for explanation.

As shown in FIG. 2, array substrate 11 includes transparent substrate 111, all routings 112 formed on transparent substrate, pixel electrode 211, and first alignment film 113. Color filter substrate 12 includes transparent substrate 121, color filter layer 122 formed on transparent substrate, black matrix 123, second alignment film 124 and corresponding electrode 221.

First alignment film 113 and second alignment film 124 are thin films with main ingredients of polyimide (PI), polyamide (PA), polyethylene (PE), polydimethylsiloxane, and so on.

Pixel electrode 211 and corresponding electrode 221 are transparent electrode, layers, made of material with light transmittance and conductivity, such as, ITO, IZO, or other similar materials.

In the instant embodiment, display area corresponded to each pixel unit of liquid crystal display device 10 is divided into a plurality of areas with liquid crystal molecules with different orientation. Through forming a plurality of areas with liquid crystal molecules 131 with different orientation in a pixel, the same viewing effect can be obtained even when viewing from different angles and viewing range is improved. The number of areas is preferably four.

Figure 3:
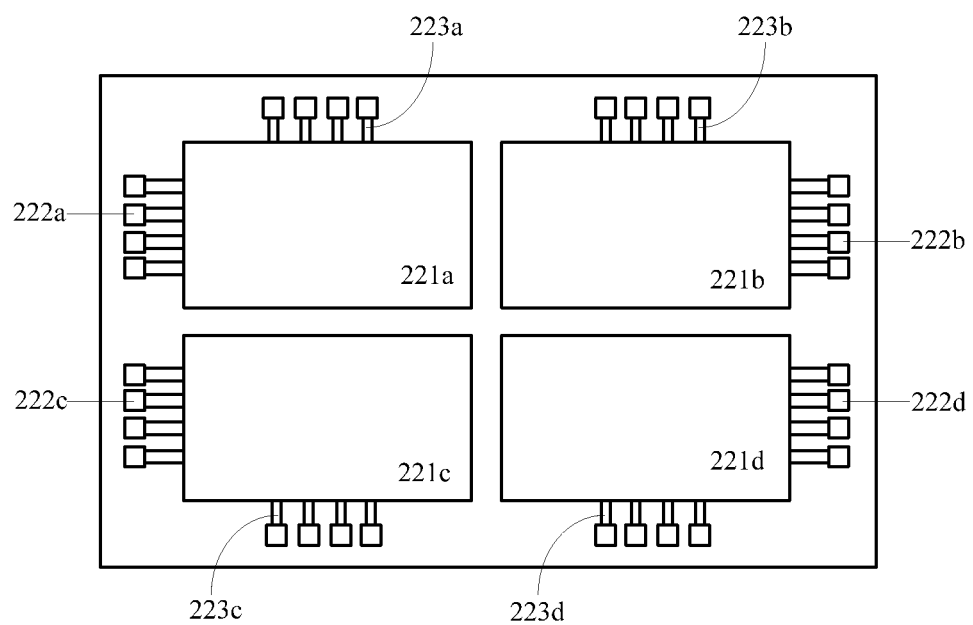
FIG. 3 is a schematic view showing a first structure of the transparent electrode pattern on color filter substrate according to the present invention.

FIG. 3 is a schematic view showing a first structure of the transparent electrode pattern on color filter substrate according to the present invention. As shown in FIG. 3, corresponding electrode 221 corresponding to a pixel electrode includes: first electrode patterns 221a, 221b, 221c, 221d, second electrode patterns, 222a, 222b, 222c, 222d, third electrode patterns 223a, 223b, 223c, 223d.

First electrode patterns 221a, 221b, 221c, 221d are disposed correspondingly to a pixel electrode 211 on first substrate 11.

Second electrode pattern 222a is connected to first electrode pattern 221a, and is disposed on outside of the first electrode pattern 221a. Second electrode pattern 222b is connected to first electrode pattern 221b, and is disposed on outside of the first electrode pattern 221b. Second electrode pattern 222c is connected to first electrode pattern 221c, and is disposed on outside of the first electrode pattern 221c. Second electrode pattern 222d is connected to first electrode pattern 221d, and is disposed on outside of the first electrode pattern 221d.

Third electrode pattern 223a is for connecting first electrode pattern 221a and second electrode pattern 222a. Third electrode pattern 223b is for connecting first electrode pattern 221b and second electrode pattern 222b. Third electrode pattern 223b is for connecting first electrode pattern 221b and second electrode pattern 222b. Third electrode pattern 223d is for connecting first electrode pattern 221d and second electrode pattern 222d.

In the instant embodiment, shape of first electrode patterns 221a, 221b, 221c, 221d and second electrode patterns 222a, 222b, 222c, 222d is preferably square, and area of each of first electrode patterns 221a, 221b, 221c, 221d and is larger than area of each of second electrode patterns 222a, 222b, 222c, 222d.

In the instant embodiment, second electrode patterns 222a, 222b, 222c, 222d is for applying an external voltage to first electrode patterns 221a, 221b, 221c, 221d so that an alignment electric field for liquid crystal layer 13 is formed between first electrode patterns 221a, 221b, 221c, 221d and pixel electrode 211.

In the present invention, corresponding electrode 221 is preferably formed by magnetron sputtering. Obviously, CVD, spray pyrolysis, sol-gel, solvothermal process can also be used.

Figure 4:
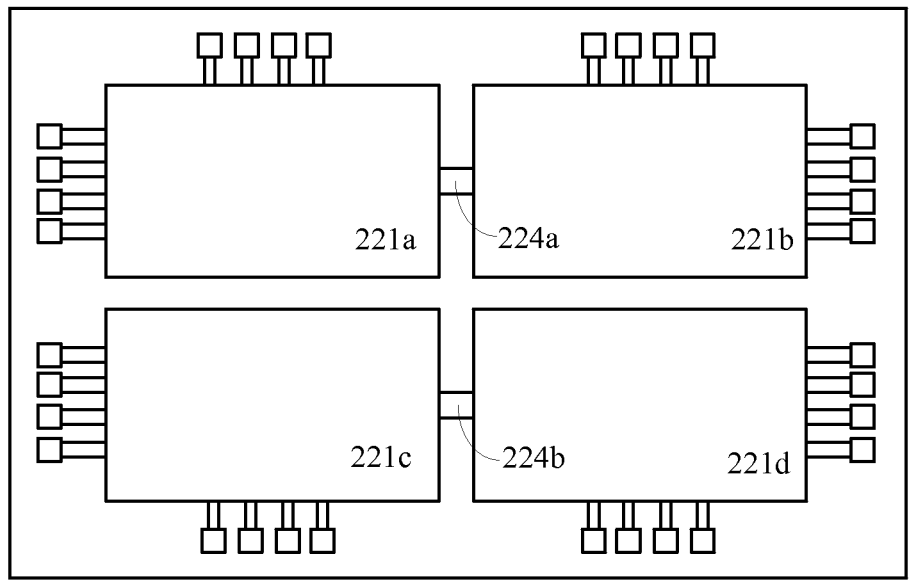
FIG. 4 is a schematic view showing a second structure of the transparent electrode pattern on color filter substrate according to the present invention.

FIG. 4 is a schematic view showing a second structure of the pattern of corresponding electrode 221 on color filter substrate 12 according to the present invention. As shown in FIG. 4, patterns of corresponding electrode 221 further include fourth electrode patterns 224a, 224b.

First electrode pattern 221a and first electrode pattern 221b are connected through fourth electrode pattern 224a. First electrode pattern 221c and first electrode pattern 221d are connected through fourth electrode pattern 224b.

Figure 5:
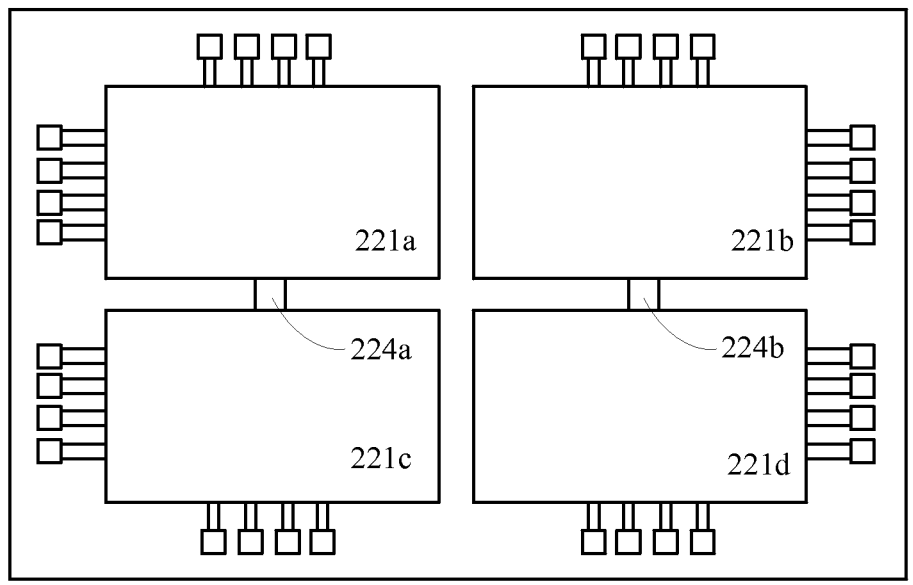
FIG. 5 is a schematic view showing a third structure of the transparent electrode pattern on color filter substrate according to the present invention.

In the present invention, fourth electrode patterns 224a, 224b are mainly for connecting first electrode patterns, leading to conducting external voltage to form required specific alignment electric field. Based on this function, the patterns of transparent electrodes on color filter substrate of the liquid crystal display device can further include the following structure:

As shown in FIG. 5, first electrode pattern 221a and first electrode pattern 221c are connected through fourth electrode pattern 224a. First electrode pattern 221b and first electrode pattern 221d are connected through fourth electrode pattern 224b.

Figure 6:
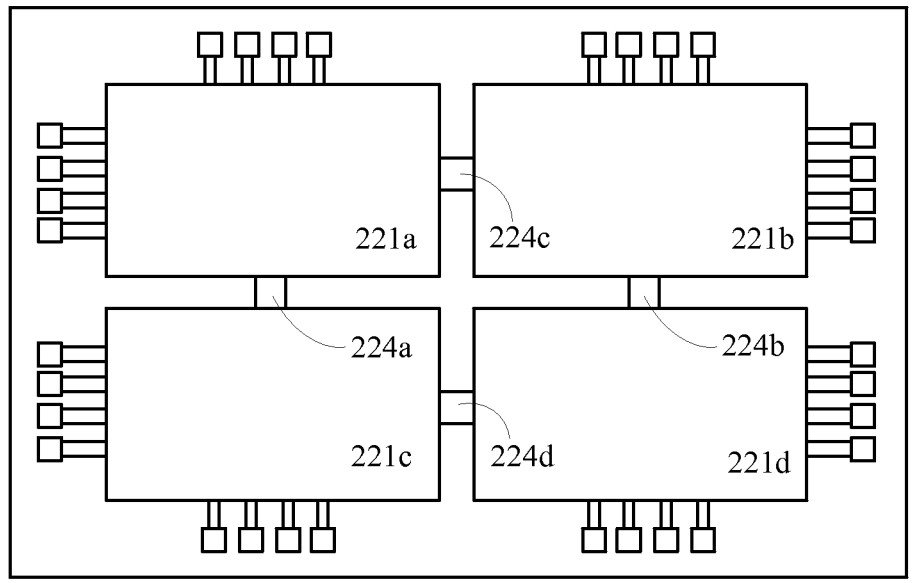
FIG. 6 is a schematic view showing a fourth structure of the transparent electrode pattern on color filter substrate according to the present invention.

As shown in FIG. 6, first electrode pattern 221a and first electrode pattern 221c are connected through fourth electrode pattern 224a. First electrode pattern 221b and first electrode pattern 221d are connected through fourth electrode pattern 224b. First electrode pattern 221a and first electrode pattern 221b are connected through fourth electrode pattern 224c. First electrode pattern 221c and first electrode pattern 221d are connected through fourth electrode pattern 224d.

Figure 7:
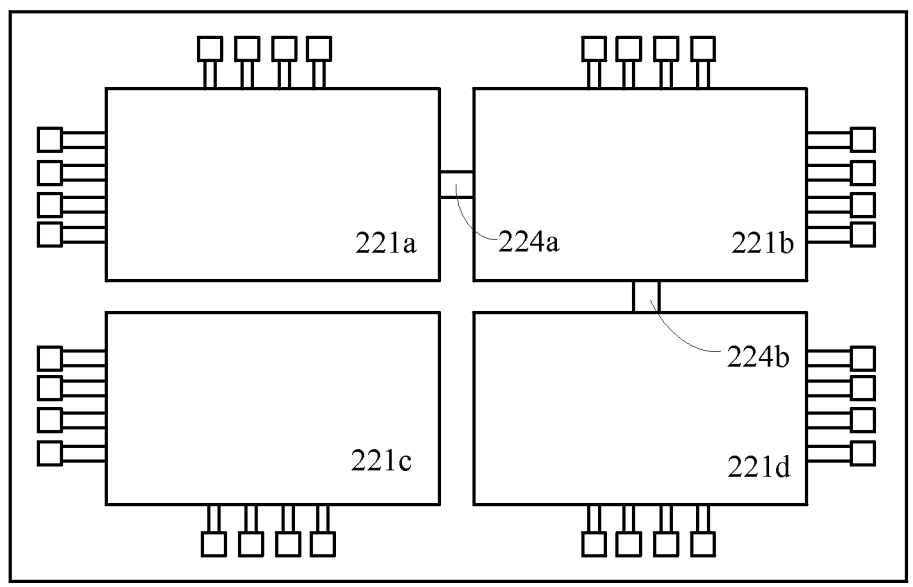
FIG. 7 is a schematic view showing a fifth structure of the transparent electrode pattern on color filter substrate according to the present invention.

As shown in FIG. 7, first electrode pattern 221a and first electrode pattern 221b are connected through fourth electrode pattern 224a. First electrode pattern 221b and first electrode pattern 221d are connected through fourth electrode pattern 224b.

It should be noted that structures shown in FIGS. 4-7 are not exhaustive. A plurality of first electrode patterns can also be connected by other numbers of fourth electrode patterns. In addition, first electrode patterns 221a, 221b, 221c, 221d, second electrode patterns 222a, 222b, 222c, 222d, third electrode patterns 223a, 223b, 223c, 223d, and fourth electrode patterns 224a, 224b, 224c, 224d are preferably formed by the same shadow mask in the film coalescent process using magnetron sputtering to form corresponding electrode 221.

Figure 8:
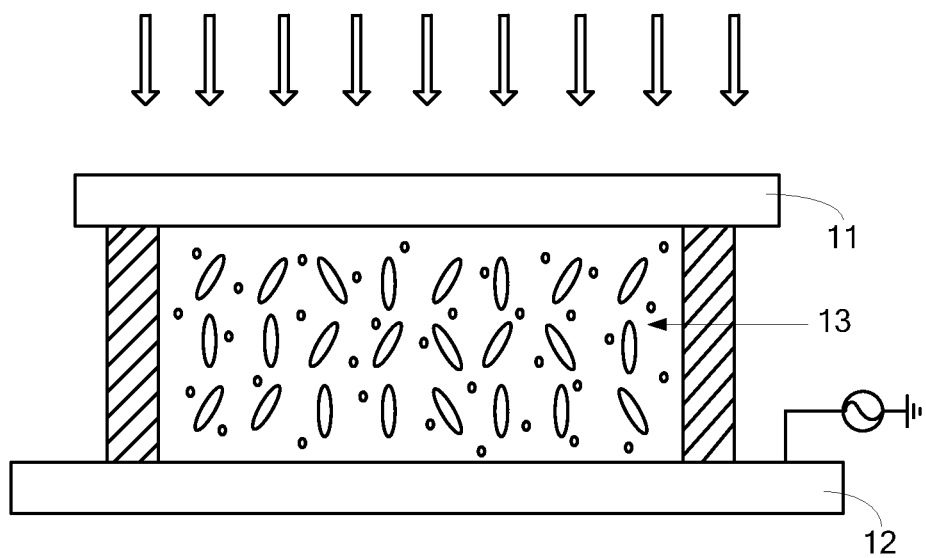
FIG. 8 is a schematic view showing performing photo-alignment on liquid crystal layer of the liquid crystal display device of the present invention.
Figure 9:
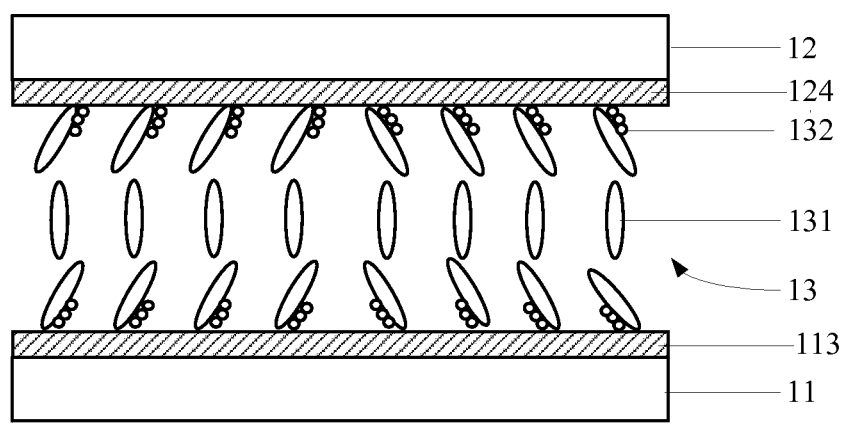
FIG. 9 is a schematic view of the liquid crystal display device of the present invention after alignment.

FIG. 8 is a schematic view showing performing photo-alignment on liquid crystal layer of the liquid crystal display device of the present invention. As shown in FIG. 8, external voltage of the present invention is applied through one side of color filter substrate 12 connected to an external voltage. Specifically, when applying external voltage, second electrode patterns on color filter substrate 12 are used as transparent electrode pattern for contact, to propagate external voltage to array substrate 11 and color filter substrate 12 so that alignment electric field for liquid crystal layer is formed between first electrode patterns 221a, 221b, 221c, 221d of corresponding electrode 221 and pixel electrode 211. Also, a UV light source (shown as arrow in FIG. 8) is used to radiate UV light onto substrates 11, 12 to make reactive monomers to line up according to electric field caused by applied voltage to accomplish alignment of liquid crystal layer of the liquid crystal display device. Specifically, when voltage signal is applied to liquid crystal layer 13 and UV radiation is applied, reactive monomers 132 polymerize to form polymer on second alignment film 124 on color filter substrate 12 and on first alignment film 113 on array substrate 11 to orient liquid crystal molecules 113 and to make liquid crystal molecules form 85-95° pretilt angle relative to array substrate 11 when no drive voltage is applied, as shown in FIG. 9, a schematic view of liquid crystal display device after alignment.

Because corresponding electrode 221 corresponding to each pixel is divided into four areas, the viewer can view the display from any one of top, bottom, left, right direction relative to the display clearly with balanced view and viewing angle is improved.

As such, liquid crystal display device of the present invention forms specific patterns of at least first electrode patterns and second electrode patterns of transparent electrode on color filter substrate 12 during film coalescent process, and the specific patterns allow externally applied voltage to enable alignment of reactive monomers in liquid crystal layer to improve success rate of liquid crystal alignment, reduce waste and reduce energy-consumption.

Figure 10:
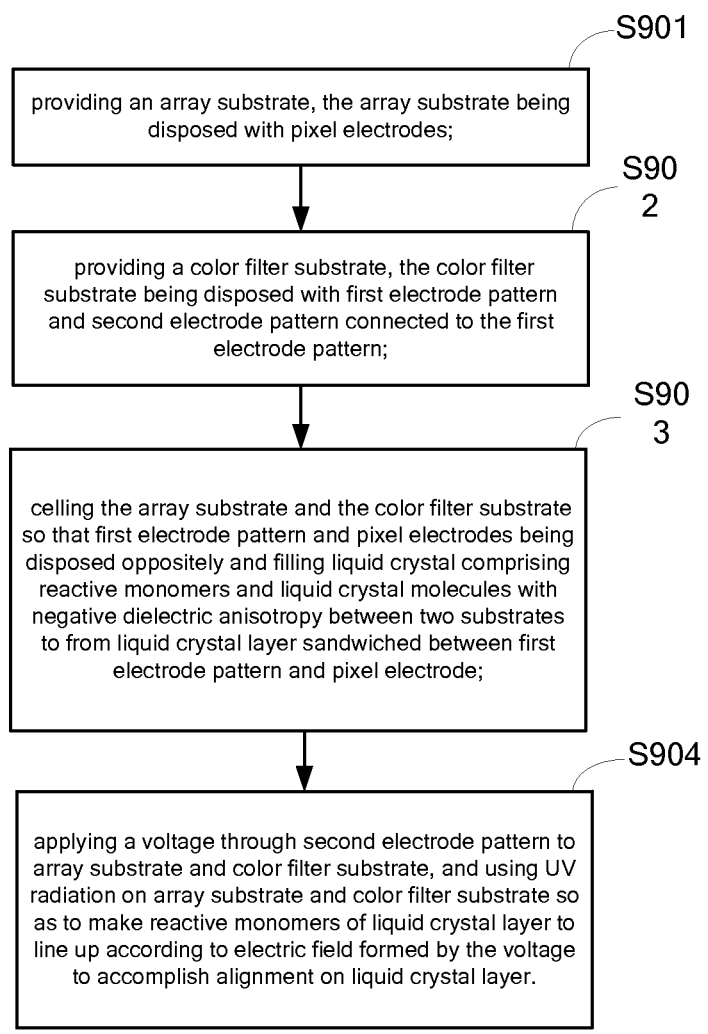
FIG. 10 is a flowchart of the manufacturing method of the liquid crystal display device according to the present invention.

FIG. 10 is a flowchart of the manufacturing method of the liquid crystal display device according to the present invention. As shown in FIG. 10, the manufacturing method of liquid crystal display device includes the steps of:

Step S901: providing array substrate, the array substrate being disposed with pixel electrodes.

In the instant embodiment, the array substrate is a substrate disposed with drive routes and pixel electrodes formed by film coalescent, exposure, lithography, etching processes on a surface of transparent substrate. Drive routes on the array substrate include, for example, scan lines and signal lines disposed in a checkered pattern on glass substrate. The scan lines and signal lines form boundaries of pixels. Pixel electrode is disposed in area bounded by boundaries of pixel.

Because the array substrate of the present invention is array substrate used in the known PSVA display mode liquid crystal display device, the specific structure and manufacturing method can refer to known technical documents, and thus is omitted here.

Step S902: providing a color filter substrate, the color substrate being disposed with first electrode patterns and second electrode patterns connected to first electrode patterns.

In the instant embodiment, color filter substrate includes transparent substrate, and color filter layer, black matrix and alignment film formed on the transparent substrate.

Because, in the color filter substrate of the present invention, color filer layer, black matrix and alignment film are the color filer layer, black matrix and alignment film in the known liquid crystal display device using PSVA display mode, the specific structure and manufacturing method can refer to known technical documents, and thus is omitted here.

Color filter substrate can further include corresponding electrode covering color filter layer and black matrix.

Figure 11:
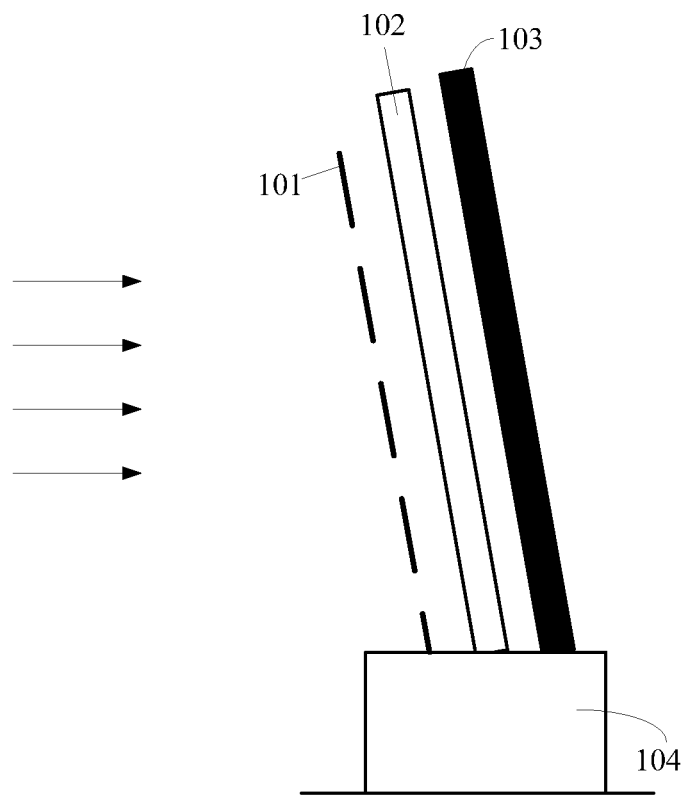
FIG. 11 is a schematic view showing the formation of transparent electrode pattern on color filter substrate according to the present invention.

FIG. 11 is a schematic view showing the formation of transparent electrode pattern on color filter substrate according to the present invention. In the present invention, after forming color filter layer and black matrix on transparent substrate of color filter substrate, specific patterns are formed by using shadow mask during film coalescent process.

As shown in FIG. 11, when forming corresponding electrode on color filter substrate, it is preferably executed by magnetron sputtering.

Specifically, magnetic plate 103, transparent substrate 102, disposed in parallel with magnetic plate 103 with a separating gap, and shadow mask 101, disposed in parallel with transparent substrate 102 with a separating gap are all fixed to carrier 104. Sputtering is performed from one side of shadow mask 101 so that electrode patterns of corresponding electrode are defined by shadow mask 101 during film coalescent processing.

In the instant embodiment, the material of corresponding electrode is preferably ITO, ZnO, IZO or other materials with light transmittance and electric conductivity.

In the instant embodiment, specific patterns formed by shadow mask 101 at least include first electrode patterns for forming liquid crystal alignment electric field and second electrode patterns for contacting externally applied voltage.

In addition, specific patterns formed by shadow mask 101 may further include third electrode patterns for connecting first electrode patterns and second electrode patterns, and fourth electrode patterns for connecting two first electrode patterns.

During specific process, specific patterns formed by shadow mask 101 can be specific electrode patterns shown in FIGS. 3-7. The specific structure can refer to description of FIGS. 3-7, and thus is omitted here.

It should be noted that first electrode patterns, second electrode patterns, third electrode patterns, and fourth electrode patterns of color filter substrate are preferably defined simultaneously by shadow mask 101 during film coalescent sputtering process.

Figure 12:
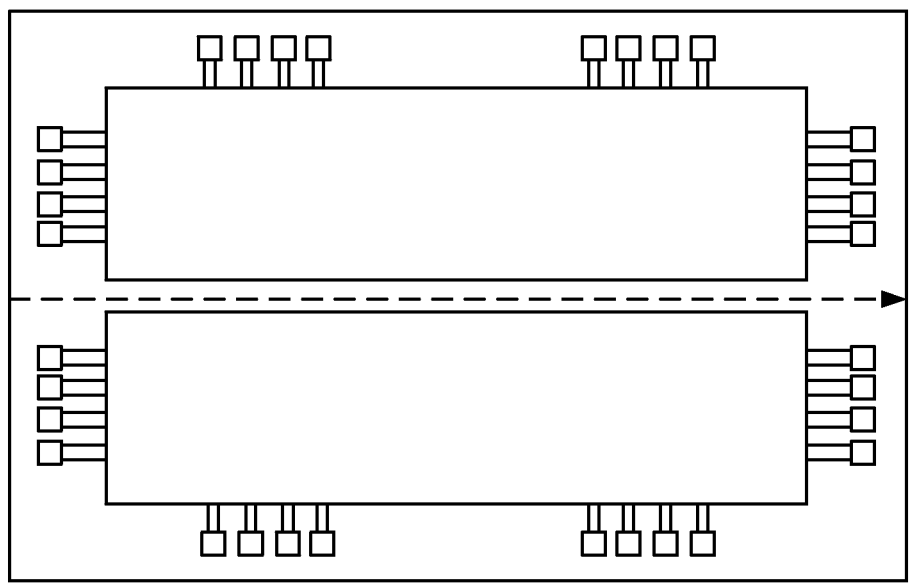
FIG. 12 is a schematic view of laser cutting route for transparent electrode pattern according to the present invention.

It is understood that in the manufacturing method of liquid crystal display device of the present invention, specific patterns formed by shadow mask 101 may be formed by means other than aforementioned approach. For example, refer to FIG. 12. FIG. 12 is a schematic view of laser cutting route for transparent electrode pattern according to the present invention. IN aforementioned Step S902, shadow mask 101 can be used for forming a whole block of first electrode pattern and a plurality of second electrode patterns. Then, laser cutting is used to cut first electrode pattern along the dash line indicated in the figure into two separate areas. Again, a second laser cutting can be performed along the line perpendicular to the dash line. In this manner, a whole block of first electrode pattern can be into four areas as shown in FIG. 3.

Obviously, laser cutting can be adjusted to cut along different routes to obtain electrode patterns shown in FIGS. 4-7.

Step S903: ceiling array substrate and color filter substrate so that first electrode pattern and pixel electrode being disposed oppositely.

In step S903, array substrate and color filter substrate are celled. In other words, through cell process, array substrate and color filter substrate are attached together and a mixture of reactive monomers and liquid crystal with negative dielectric anisotropy fills between the two substrates to form liquid crystal layer sandwiched between first electrode pattern and pixel electrode.

Step S904: applying a voltage through second electrode pattern to array substrate and color filter substrate, and using UV radiation on array substrate and color filter substrate so as to make reactive monomers of liquid crystal layer to line up according to electric field formed by the voltage to accomplish alignment on liquid crystal layer.

In step S904, the external voltage applied on array substrate and color filter substrate is through one side of color filter substrate to connect to external voltage. Specifically, through contacting second electrode patterns, the external voltage is propagated to array substrate and color filter substrate. Also, UV radiation is applied to the substrates. With this, reactive monomers of liquid crystal layer are lined up according to electric field formed by the voltage between corresponding electrode and pixel electrode to accomplish alignment on liquid crystal layer.

In summary, the present invention, through forming specific electrode patterns on transparent electrode layer of color filter substrate during film coalescent process, enables transparent electrode layer having specific electrode patterns to conduct external voltage to perform alignment on reactive monomers of liquid crystal; in other words, in the present invention, by changing the way external voltage is applied, the external voltage is introduced through one side of color filter substrate to prevent the application of external voltage from influence of yield rate of array substrate so as to improve success rate of liquid crystal alignment and reduce energy-consumption and cut down waste.

Furthermore, in the present invention, the second electrode pattern on the color filter substrate is specifically disposed for introducing external voltage, and a plurality of second electrode patterns can be disposed. Therefore, after the cell process, if a second electrode pattern is damaged, repairs can be performed or another second electrode pattern can be used instead.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A liquid crystal display device, which comprises: a plurality of pixel units, wherein each of the pixel units further comprises:
   a liquid crystal layer, comprising a plurality of liquid crystal molecules with negative dielectric anisotropy and a plurality of reactive monomers;
   one pixel electrode and a corresponding electrode, disposed on two opposite sides of the liquid crystal layer; the corresponding electrode further comprising:
   a plurality of first electrode patterns, disposed oppositely to the one pixel electrode;
   a second electrode pattern, connected to the first electrode pattern, for applying an external voltage to the first electrode pattern so as to form an alignment electric field for the liquid crystal layer between the first electrode pattern and the pixel electrode;
   a third electrode pattern, for connecting to the first electrode pattern and the second electrode pattern; and
   a fourth electrode pattern, for connecting to the first electrode patterns;
   wherein at least two of the first electrode patterns in the same corresponding electrode disposed oppositely to the one pixel electrode are connected through the fourth electrode pattern before accomplishing alignment on the liquid crystal layer.

2. The liquid crystal display device as claimed in claim 1, characterized in that the second electrode pattern is at least disposed on an outer side of one of the first electrode patterns.

3. A liquid crystal display device, which comprises: a plurality of pixel units, wherein each of the pixel units further comprises:
   a liquid crystal layer, comprising a plurality of liquid crystal molecules with negative dielectric anisotropy and a plurality of reactive monomers;
   one pixel electrode and a corresponding electrode, disposed on two opposite sides of the liquid crystal layer; the corresponding electrode further comprising:
   a plurality of first electrode patterns, disposed oppositely to the one pixel electrode; and
   a second electrode pattern, connected to the first electrode pattern, for applying an external voltage to the first electrode patterns so as to form an alignment electric field for the liquid crystal layer between the first electrode patterns and the pixel electrode; and
   a fourth electrode pattern;
   wherein at least two first electrode patterns from the first electrode patterns in the same corresponding electrode disposed oppositely to the one pixel electrode are connected through the fourth electrode pattern before accomplishing alignment on the liquid crystal layer.

4. The liquid crystal display device as claimed in claim 3, characterized in that the second electrode pattern is disposed on an outer side of the first electrode pattern, and the corresponding electrode further comprises a third electrode pattern, for connecting to the first electrode pattern and the second electrode pattern.

5. The liquid crystal display device as claimed in claim 3, characterized in that the second electrode pattern is at least disposed on an outer side of one of the first electrode patterns.

6. A manufacturing method of liquid crystal display device, which comprises:
   providing an array substrate, the array substrate being disposed with a plurality of pixel electrodes;
   providing a color filter substrate with a transparent conductive thin film layer on the color filter substrate, wherein the transparent conductive thin film layer forms a plurality of first electrode patterns and a plurality of second electrode patterns, the transparent conductive thin film layer forms a fourth electrode pattern, and at least two of the first electrode patterns in one corresponding electrode are connected through the fourth electrode pattern before accomplishing alignment on the liquid crystal layer;
   celling the array substrate and the color filter substrate so that the first electrode patterns and the pixel electrodes being disposed oppositely and filling liquid crystal comprising a plurality of reactive monomers and a plurality of liquid crystal molecules with negative dielectric anisotropy between two substrates to from a liquid crystal layer sandwiched between the first electrode patterns and the pixel electrodes, wherein the one corresponding electrode is disposed oppositely to one of the pixel electrodes; and
   applying a voltage through the second electrode patterns to the array substrate and the color filter substrate, and using an UV radiation on the array substrate and the color filter substrate so as to make the reactive monomers of the liquid crystal layer to line up according to an electric field formed by the voltage to accomplish alignment on the liquid crystal layer.

7. The method as claimed in claim 6, characterized in that the step of providing the color filter substrate further comprises:
   using magnetron sputtering to form the transparent conductive thin film layer on the color filter substrate, providing a shadow mask so that the transparent conductive thin film layer forming the first electrode patterns and the second electrode patterns defined by the shadow mask during magnetron sputtering.

8. The method as claimed in claim 7, characterized in that one of the second electrode patterns is disposed on an outer side of a corresponding one of the first electrode patterns, the transparent conductive thin film layer forms a third electrode pattern defined by the shadow mask during magnetron sputtering, and the third electrode pattern is for connecting to the first electrode pattern and the corresponded second electrode pattern.

9. The method as claimed in claim 7, characterized in that the transparent conductive thin film layer forms the first electrode patterns and the second electrode patterns defined by the shadow mask during magnetron sputtering; wherein the second electrode patterns are disposed on an outer side of one of the first electrode patterns.

10. The method as claimed in claim 8, characterized in that the transparent conductive thin film layer forms the fourth electrode pattern defined by the shadow mask during magnetron sputtering.

11. The method as claimed in claim 7, characterized in that the first electrode patterns are cut by laser cutting.

* * * * *